United States Patent [19]

Fujiwara et al.

[11] 4,058,404

[45] Nov. 15, 1977

[54] SINTERED CERAMIC DIELECTRIC BODY

[75] Inventors: Shinobu Fujiwara; Hitoshi Tanaka, both of Shinmachi, Japan

[73] Assignee: TDK Electronics Co., Ltd., Tokyo, Japan

[21] Appl. No.: 613,739

[22] Filed: Sept. 16, 1975

Related U.S. Application Data

[63] Continuation-in-part of Ser. No. 423,101, Dec. 10, 1973, abandoned.

[51] Int. Cl.$^2$ .................. C04B 35/00; C04B 35/46
[52] U.S. Cl. .................. 106/73.31; 106/46; 106/73.2; 252/63.5
[58] Field of Search ............ 106/46, 73.3, 73.31, 106/73.2; 252/63.5

[56] References Cited

U.S. PATENT DOCUMENTS

| | | | |
|---|---|---|---|
| 2,469,584 | 5/1949 | Wainer | 106/73.31 X |
| 2,992,929 | 7/1961 | Clement | 106/73.31 |
| 3,279,947 | 10/1966 | Kaiser | 106/73.31 X |
| 3,352,697 | 11/1967 | Fujiwara | 106/73.31 X |
| 3,529,978 | 9/1970 | Taylor | 106/73.31 |
| 3,609,483 | 9/1971 | Smyly | 106/73.31 |
| 3,775,142 | 11/1973 | Roup | 106/73.31 X |

*Primary Examiner*—J. Poer
*Assistant Examiner*—John F. Niebling
*Attorney, Agent, or Firm*—Burgess, Ryan and Wayne

[57] ABSTRACT

A sintered ceramic dielectric body is provided which exhibits a high dielectric constant as well as a low dielectric loss and almost no variation in the dielectric constant and the dielectric loss with respect to a wide variation of an applied high AC or DC voltage, respectively. The ceramic dielectric composition consists essentially, by weight, of approximately 18 to 70% of strontium titanate ($SrTiO_3$), approximately 4 to 75% of barium titanate ($BaTiO_3$), 2.5 to 17.4% of bismuth oxide ($Bi_2O_3$) and 1.7 to approximately 20% of titanium oxide ($TiO_2$); the ratio by mole of the titanium oxide ($TiO_2$) to the bismuth oxide ($Bi_2O_3$) being within the range from approximately 1 to 18.

5 Claims, 2 Drawing Figures

SINTERED CERAMIC DIELECTRIC BODY

This is a continuation-in-part application of application Serial No. 423,101, now abandoned.

The present invention relates to a ceramic dielectric composition which has a high dielectric constant, as well as a low dielectric loss and almost no variation in the dielectric constant and the dielectric loss with respect to a wide variation of an applied high AC or DC voltage.

Ceramic dielectrics with a high dielectric constant and a low dielectric loss and also without variations in the dielectric constant and dielectric loss with respect to wide variations in an applied voltage, are very much desired for utilization in high AC voltage apparatus or circuits. Examples of such apparatus or circuits are vacuume or gas circuit breakers and arresters or ceramic bushings in which ceramic dielectrics are used for the purpose of improving the uniformity in the distribution of AC high voltage; transmission systems in which ceramic dielectrics are used to absorb the surge voltage, and impulse voltage measuring apparatus in which ceramic dielectrics act as voltage dividers. Ceramic dielectrics having the desirable characteristics mentioned above would also be very useful in such high DC voltage apparatus for circuits as, for example, the voltage multiplying rectifiers of television receivers or oscilloscopes.

Heretoafter many ceramic dielectrics for high AC and DC voltage have been proposed. One of the known ceramic dielectric composition consists essentially of a predominant amount of barium titanate and a minor amount of other metal oxides such as titanantes of a metal other than barium and stannates of metals including barium. This ceramic dielectric composition is not advantageously employed in the abovementioned high AC and DC voltage apparatus or circuits because with this ceramic dielectric composition, variations in the dielectric constant and the dielectric loss with respect to a wide variation of an applied high AC or DC voltage are quite large.

Another prior art example of the ceramic dielectric utilized for above mentioned high voltage apparatus or circuits is disclosed in the U.S. Pat. No. 3,352,697. This ceramic dielectric material consists of a sintered mixture of 20 to 90% by weight of presintered $SrTiO_3$, 3 to 60% by weight of $Bi_2O_3$ and 5 to 60% by weight of $TiO_2$. However, this ceramic dielectric material has the disadvantage that the dielectric constant is not satisfactory and the production cost is high. Still another example is disclosed in the U.S. Pat. No. 3,529,978. This ceramic dielectric composition consists essentially of a predominant amount of barium titanate and a minor amount of additions consisting of a positive material such as ZnO or MgO and a negative material such as $Bi_3NbTiO_2$. Although this ceramic composition has a relatively high dielectric constant and relatively constant dielectric characteristics for variations in ambient temperature, it is not satisfactory in that the dielectric constant and the dielectric loss vary depending upon the variation of an applied high voltage.

It is a principal object of the present invention to provide a dielectric ceramic composition which has a high dielectric constant, as well as low dielectric loss, and almost no variation in the dielectric constant and the dielectric loss with respect to a wide variation of an applied high AC or DC voltage.

Another object of the present invention is to provide a ceramic dielectric material which exhibits a high dielectric constant, a low dielectric loss and relatively constant dielectric characteristics for variations of an applied high voltage, and possesses a dense and uniform structure.

In accordance with the present invention, there is provided a ceramic dielectric composition consisting essentially, by weight, of approximately 18 to 70% of strontium titanate ($SrTiO_3$), approximately 4 to 75% of barium titanate ($BaTiO_3$), 2.5 to 17.4% of bismuth oxide ($Bi_2O_3$) and 1.7 to approximately 20% of titanium oxide ($TiO_2$); the ratio by mole of the titanium oxide ($TiO_2$) to the bismuth oxide ($Bi_2O_3$) being within the range from approximately 1 to 18.

The present invention will be illustrated by the following examples with reference to the accompanying drawings wherein.

EXAMPLE 1

A predetermined quantity of strontium carbonate ($SrCO_3$) and a predetermined quantity of titanium dioxide ($TiO_2$) are mixed, and pre-sintered at 1150° C for 2 hours. Then the pre-sintered mixture is sulveriged into a powder. This powder consists of strontium titanate ($SrTiO_3$). $SrTiO_2$, $TiO_2$, $Bi_2O_3$ and BaO (BaO may be exchanged with $BaCO_3$) are then mixed in the weight proportions (%) as indicated in colums 1 and 2 of Table I. The obtained mixture, after minor amounts of binders are added, is pressed and shaped into disks of 16.5 mm diameter and 10 mm thickness under a pressure of 2000 kg/cm². Then, the discs are sintered at a temperature of 1,100 to 1,300 ° C for 2 hours. Then, the opposite faces of resultant ceramic discs are coated with a silver electrode paste. After the coating said ceramic discs are heated in air up to about 800° C, and thus the coated silver electrode material is plated on the faces of said ceramic body.

Column 1 of Table I, below, shows proportions in % by weight of the materials, $SrTiO_3$, $Bi_2O_3$, $TiO_2$ and $BaTiO_3$, of eighteen specimens which were produced by the procedure mentioned above. Column 2, of Table I, shows the compositions (in % by weight) of the ceramic dielectrics of the respective specimens in terms of oxides which are SrO, $Bi_2O_3$, $TiO_2$ and BaO. Columns 3, 4, 5 and 6 of Table I show the various dielectric characteristics of the respective specimens. The dielectric constant $\epsilon$ at AC 5V (at 1 KHz), the dielectric loss factor tan $\delta$ in % at AC 5V (at 1 KHz), the characteristics chaning ratio $\Delta c/c_1$ in % and $\Delta c/c_2$ in % at AC 0.5 KV r.m.s/mm, respectively, and the characteristics changing ratio $\Delta c/c_1$ in % at DC 1.5 KV/mm of respective specimens are shown in the columns 3, 4, 5 and 6, respectively. The characteristics changing ratio $\Delta c/c_1$ and $\Delta c/c_2$ are defined as follows.

$$\Delta c/c_1 =$$

-continued $$\Delta c/c_2 = \frac{[\epsilon]\,\text{at AC 5V}\,(\text{at 1 KHz}) - [\epsilon]\,\begin{array}{c}\text{at AC 0.5 KV/mm (at 50 KHz)}\\ \text{or}\\ \text{at DC 1.5 KV/mm}\end{array}}{[\epsilon]\,\text{at AC 5V}\,(\text{at 1 KHz})} \times 100$$

$$\Delta c/c_2 = \frac{[\tan\delta]\,\text{at AC 5V}\,(\text{at 1 KHz}) - [\tan\delta]\,\begin{array}{c}\text{at AC 0.5 KV/mm (at 50 Hz)}\\ \text{or}\\ \text{at DC 1.5 KV/mm}\end{array}}{[\tan\delta]\,\text{at AC 5V}\,(\text{at 1 KHz})} \times 100$$

In Table I, specimens 1 and 15 are beyond the limits of the present invention, and specimens 19, 20 and 21 are examples of known ceramic dielectrics. These specimens are inserted in Table I for reference purpose.

Figure 1:
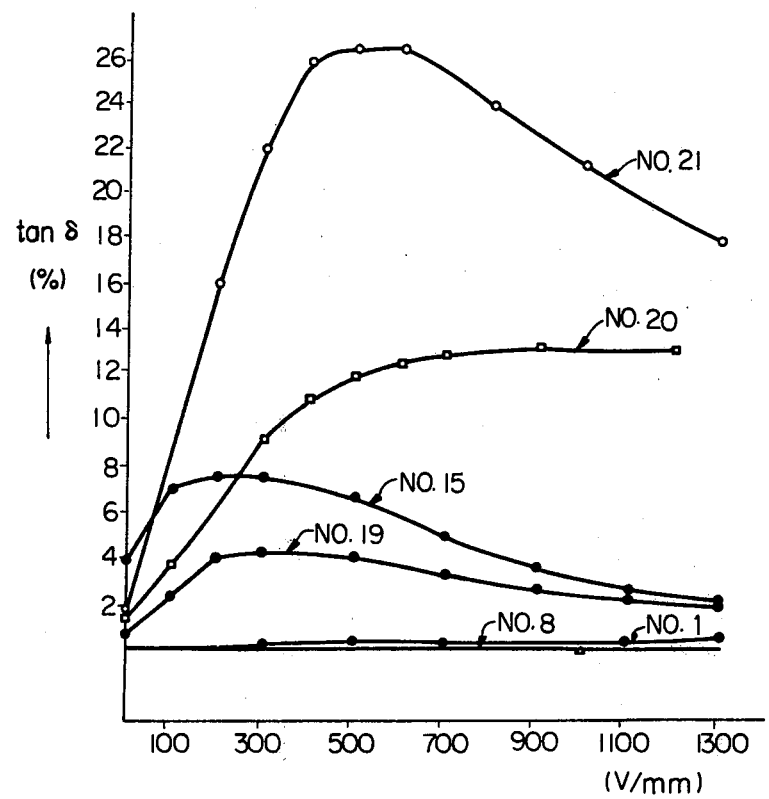
FIG. 1 shows the variations in the dielectric loss factor (tan $\delta$ in %) of ceramic dielectrics with respect to the variation of the applied AC voltage gradient (by V/mm)

FIG. 1 shows the variation in the dielectric loss factor tan δ (in %) in the ceramic dielectric of specimen 8 according to the present invention; the variations of the dielectric loss factor tan δ (in %) of specimens 1 and 15, which are beyond the limits of the present invention, and; the variations in the dielectric loss factor tan δ (in %) of specimens 19, 20 and 21. In FIG. 1 the variations in the dielectric loss tan δ are expressed in terms of the variations of the applied AC V (r.m.s.)/mm at 50 Hz.

Figure 2:
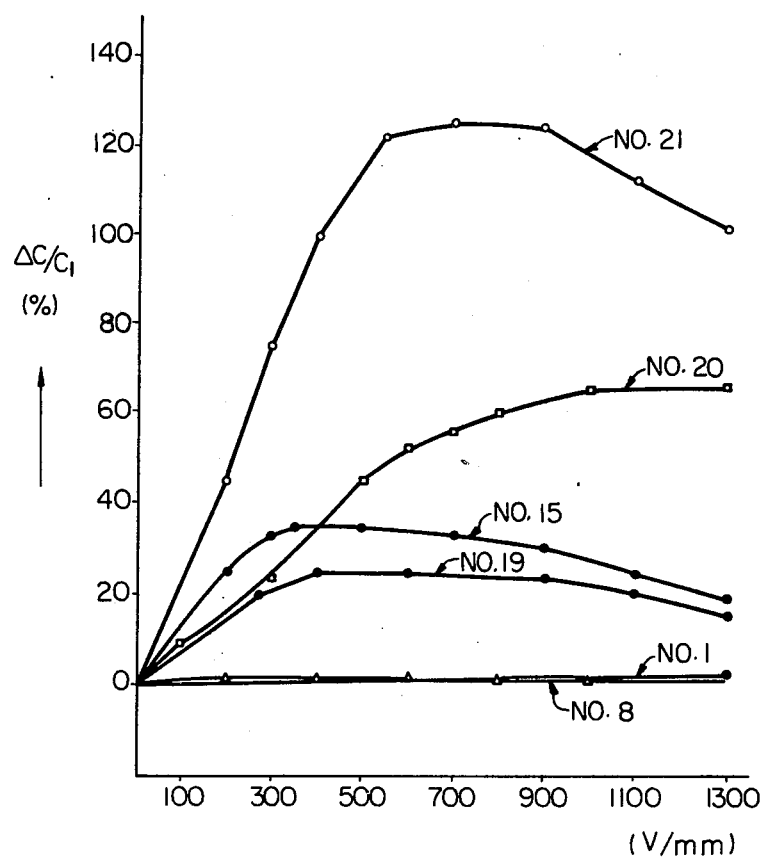
FIG. 2 shows the variations of the characteristics changing ratio $\Delta c/c_1$, hereinafter definied of ceramic dielectrics with respect to the variation of applied AC voltage gradient (by V/mm).

FIG. 2 shows the variation in the characteristics changing ratio Δc/c$_1$ (in %) of each of the above-mentioned ceramic dielectrics in FIG. 1, in the same way as illustrated in FIG. 1. The characteristics changing ratio Δc/c$_1$ in FIG. 2 is defined as follows.

$$\Delta c/c_1 = \frac{[\epsilon]\,\text{at AC 5V}\,(\text{at 1 KHz}) - [\epsilon]\,\text{at an applied AC voltage gradient (at 50 Hz)}}{[\epsilon]\,\text{at AC 5V}\,(\text{at 1 KHz})} \times 100$$

As is clear from Table I and FIGS. 1 and 2, the ceramic dielectrics according to the present invention have a high dielectric constant and a low dielectric loss, as well as almost no variations in dielectric constant and dielectric loss with respect to the variation in the applied AC or DC voltage, respectively. That is, the dielectric constant ε is 1000 to 4700, the dielectric loss factor tan δ is 0.1 to 1.3% and the characteristics changing ratio Δc/c$_1$, as defined above, is +0.8 to +19% at AC and −17 to −1.2% at DC.

Table 1

| Specimen No. | Proportion of Materials | | | | | Proportion of Simple Oxides | | | |
|---|---|---|---|---|---|---|---|---|---|
| | SrTiO$_3$ wt % | Bi$_2$O$_3$ wt % | TiO$_2$ wt % | X in Bi$_2$O$_3$ XTiO$_2$ | BaTiO$_3$ wt % | SrO wt % | Bi$_2$O$_3$ wt % | TiO$_2$ wt % | BaO wt % |
| *1 | 72.7 | 18.2 | 9.1 | 3 | — | 41.0 | 18.2 | 40.8 | — |
| 2 | 69.6 | 17.4 | 8.7 | 3 | 4.3 | 39.3 | 17.4 | 40.5 | 2.8 |
| 3 | 66.4 | 9.1 | 20.1 | 13 | 4.4 | 37.5 | 9.1 | 50.5 | 2.9 |
| 4 | 61.5 | 15.4 | 7.7 | 3 | 15.4 | 34.7 | 15.4 | 39.8 | 10.1 |
| 5 | 50.9 | 12.7 | 6.4 | 3 | 30 | 28.7 | 12.7 | 38.9 | 19.7 |
| 6 | 50.9 | 16.7 | 2.4 | 0.8 | 30 | 28.7 | 16.7 | 34.9 | 19.7 |
| 7 | 43.6 | 10.9 | 5.5 | 3 | 40 | 24.6 | 10.9 | 38.2 | 26.3 |
| 8 | 36.4 | 9.1 | 4.5 | 3 | 50 | 20.6 | 9.1 | 37.4 | 32.9 |
| 9 | 36.4 | 3.7 | 9.9 | 16 | 50 | 20.6 | 3.7 | 42.8 | 32.9 |
| 10 | 29.1 | 7.3 | 3.6 | 3 | 60 | 16.4 | 7.3 | 36.9 | 39.4 |
| 11 | 19.4 | 4.8 | 2.4 | 3 | 73.4 | 11.0 | 4.8 | 36.0 | 48.2 |
| 12 | 18.2 | 4.5 | 2.3 | 3 | 75 | 10.3 | 4.5 | 35.9 | 49.3 |
| 13 | 18.2 | 5.1 | 1.7 | 2 | 75 | 10.3 | 5.1 | 35.3 | 49.3 |
| 14 | 18.2 | 4.0 | 2.8 | 4 | 75 | 10.3 | 4.0 | 36.4 | 49.3 |
| *15 | 14.5 | 3.7 | 1.8 | 3 | 80 | 8.2 | 3.7 | 35.5 | 52.6 |
| 16 | 45 | 2.5 | 2.5 | 5.8 | 50 | 25.4 | 2.5 | 39.2 | 32.9 |
| 17 | 30 | 5.0 | 15.0 | 18 | 50 | 16.9 | 5.0 | 45.2 | 32.9 |
| 18 | 30 | 10 | 10 | 5.8 | 50 | 16.9 | 10 | 40.2 | 32.9 |
| 19 | — | — | — | — | — | BaTiO$_3$ 64.5 | BaZrO$_3$ 18.9 | CaTiO$_3$ 10.9 | MgTiO$_3$ 5.7 |
| 20 | — | — | — | — | — | BaTiO$_3$ 88.0 | Bi$_2$(SnO$_3$)$_3$ 12.0 | | |
| 21 | — | — | — | — | — | BaTiO$_3$, 94.1 | Bi$_2$(SnO$_3$)$_3$ 5.9 | | |

Asterisked specimens are beyond the limits of the present invention

| Specimen No. | 3 ε at AC 5V (at 1 KHz) | 4 tanδ % at AC 5V (at 1 KHz) | 5 at AC 0.5 KV r.m.s/mm (at 50 Hz) | | 6 at DC 1.5 Kv/mm |
|---|---|---|---|---|---|
| | | | Δc/c$_1$ (%) | Δc/c$_2$ (%) | Δc/c$_1$ (%) |
| *1 | 960 | 0.1 | +1.1 | 0.4 | −2.5 |
| 2 | 1110 | 0.1 | +1.0 | 0.1 | −1.7 |
| 3 | 1070 | 0.12 | +2.1 | 0.3 | −2.2 |
| 4 | 1240 | 0.1 | +1.3 | 0.15 | −2.7 |
| 5 | 1260 | 0.1 | +0.8 | 0.1 | −1.8 |
| 6 | 1200 | 0.4 | +1.8 | 0.8 | +2.8 |
| 7 | 1430 | 0.1 | +2.0 | 0.2 | −3.0 |
| 8 | 1780 | 0.1 | +1.8 | 0.1 | −3.0 |
| 9 | 1680 | 0.1 | +2.3 | 0.2 | −3.7 |
| 10 | 2580 | 0.1 | +2.5 | 0.15 | −6.7 |
| 11 | 3810 | 1.2 | +16.0 | 1.8 | −14.2 |
| 12 | 4140 | 1.3 | +17.5 | 2.0 | −13.8 |
| 13 | 4650 | 1.3 | +16.8 | 2.0 | −16.7 |
| 14 | 4230 | 1.1 | +18.7 | 2.3 | −17.1 |
| *15 | 2350 | 3.8 | +35.0 | 6.8 | −29.0 |
| 16 | 1470 | 0.1 | +0.8 | 0.1 | −1.2 |
| 17 | 2170 | 0.66 | +2.8 | 1.3 | −5.7 |
| 18 | 1950 | 0.82 | +6.7 | 1.5 | −10.8 |
| 19 | 2700 | 0.7 | +22.8 | 4.1 | −33.5 |
| 20 | 1600 | 1.2 | +45.0 | 12.0 | −13.8 |

Table 1-continued

| 21 | 2600 | 2.0 | +114.0 | 26.7 | −25.7 |

As seen from Table I, the desired dielectric characteristics are obtainable when the dielectric composition consists essentially, by weight, of approximately 18 to 70% of strontium titanate ($SrTiO_3$), approximately 4 to 75% of barium titanate ($BaTiO_3$), 2.5 to 17.4% of bismuth oxide ($Bi_2O_3$) and 1.7 to approximately 20% of titanium oxide ($TiO_2$), and the ratio by mole of the titanium oxide ($TiO_2$) to the bismuth oxide ($Bi_2O_3$), i.e. "$x$" of the formula $Bi_2O_3 \cdot TiO_2$, falls within the range from approximately 1 to 18.

EXAMPLE 2

A ceramic dielectric which is of a dense and uniform structure is obtained when the materials, as shown in column 1, of Table I, of the ceramic dielectric are sintered. That is, a small amount of mineralizer is added to the ceramic dielectric material and then the mixture is sintered. It is known that the mineralizer acts to prevent the ceramic dielectric from being reduced in weight by the air during sintering. However, the various dielectric characteristics of the ceramic dielectric, such as shown in columns 3, 4, 5 and 6 of Table I, are not sacrificed when the ceramic dielectric is made dense and uniform. In this example 2, a small amount of mineralizer is added to specimen 2, shown in Table I, comprising 39.3% by weight of SrO, 17.4% by weight of $Bi_2O_3$, 40.5% by weight of $TiO_2$ and 2.8% by weight of BaO. Further, three kinds of materials are selected as the mineralizer and these are manganese carbonate ($MnCO_3$), clay and dilanthanum trioxide ($La_2O_3$). As can be seen in column 2, of Table II, six specimens 22, 23, 24, 25, 26 and 27 are produced for the examples, wherein specimens 22 and 23 contain 0.2 and 0.5% by weight, respectively, of $MnCO_3$, specimens 24 and 25 contain 0.2 and 0.5% by weight, respectively, of clay and specimens 26 and 27 include 0.2 and 0.5% by weight, respectively, of $La_2O_3$. Table II, column 1, shows the composition of the ceramic dielectric of the respective specimens 22 to 27, in terms of simple oxide, which is substantially the same as the composition of specimen 2 shown in column 2, of Table I. The columns 3, 4, 5 and 6, of Table II, indicate dielectric characteristics, and are the same as the corresponding columns in Table I. The specimen 2 is included in Table II to clarify the differences between the dielectric characteristics of specimen 2 with the mineralizer and specimen 2 without the mineralizer.

As is clear from the Table II, the electric characteristics of specimens 22 through 27 with the mineralizer are as good as specimen 2. However, when more than 3% by weight of the mineralizer is added to the materials of the ceramic dielectric, the dielectric characteristics become unsatisfactory and, therefore, the amount of the mineralizer added should preferably be not more than 3% by weight. The minimum amount of the mineralizer should preferably be 0.1% by weight in order to make the sintered ceramic dielectric dense and uniform. It should be noted that the advantage of making the ceramic dielectric dense and uniform by adding mineralizer, can not only be obtained for specimen 2 but also for specimens 3 through 18 in Table I. The mineralizers are not limited to those shown in column 2, of Table II; the mineralizer $MnCO_3$ can be exchanged for other compounds including, for example, MnO. Naturally, in this case, the weight % of said compounds, including the MnO to be added, may be different from that of $MnCO_3$ shown in column 2, of Table II. However the weight % of said compounds including MnO, as mentioned above, should be no more than 3%.

Suitable mineralizers include clay, manganese oxide, chromium oxide, tantalum oxide, niobium oxide, oxides of the iron family element such as iron or cobalt, and oxides of the rare earth elements such as lanthanum and cerium.

EXAMPLE 3

The object of the present invention can also be accomplished by substituting a part of the titanates of the divalent metals, i.e. $BaTiO_3$ and $SrTiO_3$, and the titanium for other divalent metal titanates and other tetravalent metals, respectively.

In specimen 8, shown in Table I, comprising 20.6% by weight of SrO, 9.1% by weight of $Bi_2O_3$, 37.4% by weight of $TiO_2$ and 32.9% by weight of BaO, the divalent metal oxide BaO is replaced by another divalent metal oxide PbO and the $TiO_2$ is replaced by another tetravalent metal oxide $ZrO_2$. However, the various dielectric characteristics, such as shown in columns 3, 4, 5 and 6, of the ceramic dielectric are not adversely affected by said replacements. As can be seen in Table III, the four specimens 28, 29, 30 and 31 are produced for the examples. In specimens 28 and 29, 10% and 20% by weight of the BaO of specimen 8 are respectively replaced by PbO. In the specimens 30 and 31, 10% and 20% by weight of the $TiO_2$ of specimen 8 are respectively replaced by $ZrO_2$. These replacements are shown in columns 1 and 2, of Table III. Table III, column 1, shows the composition of the ceramic dielectric of the respective specimens, 28 through 31, in terms of simple oxide and the compositions of SrO and $Bi_2O_3$ are same as that of column 2, in Table I, with regard to specimen 8. The columns 3, 4, 5 and 6, of Table III, indicate electrical characteristics, and are the same as the corresponding columns in Table I. Specimen 8 is included in Table III to clarify the differences between the dielectric characteristics of specimen 8 and specimen 8 effected by said replacement.

As is clear from columns 3 through 6, of Table III, the dielectric characteristics of specimen 8 are not adversely affected when one of the materials of specimen 8 is partially replaced by other materials which are the same as the original materials of specimen 8.

Generally speaking, titanates of the divalent metals, such as Sr or Ba shown in columns 1 and 2, of Table I, can be replaced by titanates of other divalent metals, such as Ca, Zn, Mg, Cd or Pb. Similarly, the titanium shown in columns 1 and 2, of Table I, can be replaced by other tetravalent metals, such as Sn, Hf or Zr. In cases where the divalent metal titanates are replaced by a titanate of another divalent metal, less than 30% by weight of the total amount of the strontium titanate ($SrTiO_3$) and the barium titanate ($BaTiO_3$) may be replaced by at least one titanate selected from calcium titanate ($CaTiO_3$), zinc titanate ($ZnTiO_3$), magnesium titanate ($MgTiO_3$) and cadmium titanate ($CdTiO_3$), or less than 50% by weight of the total amount of the strontium titanate ($SrTiO_3$) and the barium titanate ($BaTiO_3$) may be replaced by lead titanate ($PbTiO_3$). In cases where the titanium of $TiO_2$, including those constituting the strontium titanate (SrTiO$_3$) and the barium titanate (BaTiO$_3$), is replaced by another tetravalent metal, less than 30% by weight of the total amount of the titanium oxide (TiO$_2$) may be replaced by at least one oxide selected from zirconium oxide (ZrO$_2$), tin oxide (SnO$_2$) and hafnium oxide (HfO$_2$).

Table II

| Specimen No. | Proportion of Simple Oxides | | | | Proportion of Mineralizer | | |
|---|---|---|---|---|---|---|---|
| | SrO wt % | Bi$_2$O$_3$ wt % | TiO$_2$ wt % | BaO wt % | MnCO$_3$ wt % | Clay wt % | La$_2$O$_3$ wt % |
| 2 | 39.5 | 17.0 | 40.5 | 3.0 | — | — | — |
| 22 | " | " | " | " | 0.2 | — | — |
| 23 | " | " | " | " | 0.5 | — | — |
| 24 | " | " | " | " | — | 0.2 | — |
| 25 | " | " | " | " | — | 0.5 | — |
| 26 | " | " | " | " | — | — | 0.2 |
| 27 | " | " | " | " | — | — | 0.5 |

| Specimen No. | 3<br>ε<br>at AC 5V<br>(at 1 KHz) | 4<br>tan δ %<br>at AC 5V<br>(at 1 KHz) | 5 at AC 0.5 KV r.m.s/mm at 50 Hz | | 6 at DC 1.5 KV/mm c/c$_1$ (%) |
|---|---|---|---|---|---|
| | | | Δc/c$_1$ (%) | Δc/c$_2$ (%) | |
| 2 | 1110 | 0.1 | +0.1 | 0.1 | −1.7 |
| 22 | 1142 | 0.1 | +1.2 | 0.12 | −2.2 |
| 23 | 1109 | 0.2 | +1.4 | 0.12 | −2.3 |
| 24 | 1090 | 0.1 | +1.2 | 0.1 | −2.5 |
| 25 | 922 | 0.1 | +1.2 | 0.1 | −2.7 |
| 26 | 1050 | 0.1 | +1.0 | 0.1 | −2.1 |
| 27 | 988 | 0.07 | +1.0 | 0.6 | −2.1 |

Table III

| Specimen No. | Proportion of Simple Oxides | | | Proportion of Simple Oxides | | |
|---|---|---|---|---|---|---|
| | SrO wt % | Bi$_2$O$_3$ wt % | TiO$_2$ wt % | BaO wt % | PbO wt % | ZrO$_2$ wt % |
| 8 | 20.6 | 9.1 | 37.4 | 32.9 | — | — |
| 28 | " | " | 37.4 | 29.61 | 3.29 | — |
| 29 | " | " | 37.4 | 26.32 | 6.58 | — |
| 30 | " | " | 33.66 | 32.9 | — | 3.74 |
| 31 | " | " | 29.92 | 32.9 | — | 7.48 |

| Specimen No. | 3<br>ε<br>at AC 5V<br>at 1 KHz | 4<br>tan δ %<br>at AC 5V<br>at 1 KHz | 5 at AC 0.5 KV r.m.s. /mm at 50 Hz | | 6 at DC 1.5 KV/mm Δc/c$_1$ (%) |
|---|---|---|---|---|---|
| | | | Δc/c$_1$ (%) | Δc/c$_2$ (%) | |
| 8 | 1780 | 0.1 | +1.8 | 0.1 | −3.0 |
| 28 | 1750 | 0.15 | +1.4 | 0.1 | −3.1 |
| 29 | 1740 | 0.15 | +2.0 | 0.2 | −2.5 |
| 30 | 1680 | 0.15 | +1.7 | 0.3 | −2.7 |
| 31 | 1650 | 0.15 | +1.5 | 0.3 | −2.4 |

What we claim is:

1. A sintered ceramic dielectric body having a high dielectric constant, as well as a low dielectric loss and almost no variation in the dielectric constant and the dielectric loss with respect to a wide variation of an applied high AC or DC voltage, which consists essentially, by weight, of approximately 18 to 70% of strontium titanate (SrTiO$_3$), approximately 4 to 75% of barium titanate (BaTiO$_3$), 2.5 to 17.4% of bismuth oxide (Bi$_2$O$_3$) and 1.7 to approximately 20% of titanium oxide (TiO$_2$); the ratio by mole of the titanium oxide (TiO$_2$) to the bismuth oxide (Bi$_2$O$_3$) being within the range from approximately 1 to 18.

2. A sintered ceramic dielectric body according to claim 1 which further comprises 0.1% to 3% by weight of at least one member selected from the group consisting of clay, manganese oxide, chromium oxide, niobium oxide, tantalum oxide, iron oxide, cobalt oxide and oxides of rare earth elements.

3. A sintered ceramic dielectric body according to claim 1 wherein less than 30% by weight of the total amount of the strontium titanate (SrTiO$_3$) and the barium titanate (BaTiO$_3$) is replaced by at least one compound selected from the group consisting of calcium titanate (CaTiO$_3$), zinc titanate (ZnTiO$_3$) magnesium titanate (MgTiO$_3$) and cadmium titanate (CdTiO$_3$).

4. A sintered ceramic dielectric body according to claim 1 wherein less than 50% by weight of the total amount of the strontium titanate (SrTiO$_3$) and the barium titanate (BaTiO$_3$) is replaced by lead titanate (PbTiO$_3$).

5. A sintered ceramic dielectric body according to claim 1 wherein less than 30% by weight of the total amount of the titanium oxide (TiO$_2$) including those constituting the strontium titanate (SrTiO$_3$) and the barium titanate (BaTiO$_3$) is replaced by at least one compound selected from the group consisting of zirconium oxide (ZrO$_2$), tin oxide (SnO$_2$) and hafnium oxide (HfO$_2$).

* * * * *

UNITED STATES PATENT OFFICE
CERTIFICATE OF CORRECTION

Patent No. 4,058,404     Dated November 15, 1977

Inventor(s) Shinobu Fujiwara, et al

It is certified that error appears in the above-identified patent and that said Letters Patent are hereby corrected as shown below:

In the lower third of columns 3 and 4, the last Table 1, "Specien" should be --Specimen--.

Signed and Sealed this

Eighteenth Day of April 1978

[SEAL]

Attest:

RUTH C. MASON
Attesting Officer

LUTRELLE F. PARKER
Acting Commissioner of Patents and Trademarks